(12) United States Patent
Sasaki

(10) Patent No.: US 10,622,988 B2
(45) Date of Patent: Apr. 14, 2020

(54) POWER SEMICONDUCTOR MODULE AND DRIVE CIRCUIT

(71) Applicant: FUJI ELECTRIC CO., LTD., Kanagawa (JP)

(72) Inventor: Masahiro Sasaki, Kanagawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/862,202

(22) Filed: Jan. 4, 2018

(65) Prior Publication Data

US 2018/0205372 A1 Jul. 19, 2018

(30) Foreign Application Priority Data

Jan. 18, 2017 (JP) .................................. 2017-007129

(51) Int. Cl.
| | | |
|---|---|---|
| *H03K 17/08* | (2006.01) | |
| *H03K 17/082* | (2006.01) | |
| *H02M 1/088* | (2006.01) | |
| *H02M 1/32* | (2007.01) | |
| *H03K 17/567* | (2006.01) | |
| *H03K 17/16* | (2006.01) | |
| *G01R 31/02* | (2006.01) | |

(52) U.S. Cl.
CPC ........ *H03K 17/0828* (2013.01); *H02M 1/088* (2013.01); *H02M 1/32* (2013.01); *H03K 17/168* (2013.01); *H03K 17/567* (2013.01); *G01R 31/025* (2013.01); *H03K 17/166* (2013.01)

(58) Field of Classification Search
CPC .. H03K 17/08; H03K 17/082; H03K 17/0822; H03K 17/0826; H03K 17/0828
See application file for complete search history.

(56) References Cited

U.S. PATENT DOCUMENTS 5,099,138 A * 3/1992 Fukunaga ............... H02M 1/38
326/21
5,396,117 A * 3/1995 Housen .............. H03K 17/0826
327/434

(Continued)

FOREIGN PATENT DOCUMENTS

| JP | 2012-023234 | 2/2012 |
|---|---|---|
| JP | 2014-230307 | 12/2014 |
| JP | 2015-073147 | 4/2015 |

*Primary Examiner* — Thomas J. Hiltunen
(74) *Attorney, Agent, or Firm* — Wenderoth, Lind & Ponack, L.L.P.

(57) ABSTRACT

A power semiconductor module includes an insulated-gate type power semiconductor device, and a drive circuit controlling a gate voltage applied to the power semiconductor device in accordance with an input signal to drive the power semiconductor device so as to turn ON and OFF. The drive circuit includes a variable resistance circuit changing the gate voltage to the power semiconductor device, and a short-circuit state detecting circuit which maintains the resistance value of the variable resistance circuit to be a predetermined value at the time of a normal operation of the power semiconductor device, and which increases the resistance value of the variable resistance circuit so as to be greater than the predetermined value when a short-circuit state of the power semiconductor device is detected to suppress an oscillation in the power semiconductor device.

10 Claims, 7 Drawing Sheets

(56) References Cited

U.S. PATENT DOCUMENTS

| | | | | |
|---|---|---|---|---|
| 5,808,504 A * | 9/1998 | Chikai | H03K 17/0406 | 327/380 |
| 5,818,284 A * | 10/1998 | Murakami | H03K 17/04213 | 327/478 |
| 6,384,552 B2 * | 5/2002 | Shinnane | B60L 11/1803 | 318/139 |
| 6,845,022 B2 * | 1/2005 | Yoshimura | H02M 7/5387 | 363/95 |
| 7,095,270 B2 * | 8/2006 | Liu | G05F 1/575 | 327/540 |
| 7,245,163 B2 * | 7/2007 | Nakamura | H02P 1/18 | 327/110 |
| 7,486,144 B2 * | 2/2009 | Mitzlaff | H03F 1/523 | 330/298 |
| 7,501,883 B2 * | 3/2009 | Cho | G05F 1/465 | 327/530 |
| 7,509,105 B2 * | 3/2009 | Ziegler | H01J 37/32174 | 455/222 |
| 7,737,761 B2 * | 6/2010 | Ishikawa | H03K 17/567 | 327/170 |
| 8,102,687 B2 * | 1/2012 | Takasu | H02M 3/1582 | 363/132 |
| 8,130,024 B2 * | 3/2012 | Zimlich | H03L 7/0814 | 327/512 |
| 8,299,820 B2 * | 10/2012 | Deboy | H03K 17/166 | 327/108 |
| 8,362,812 B2 * | 1/2013 | Lee | H02M 1/08 | 327/109 |
| 8,471,536 B2 * | 6/2013 | Wu | H02M 1/4225 | 323/222 |
| 8,829,946 B2 * | 9/2014 | Deboy | H03K 17/166 | 327/108 |
| 8,829,976 B2 * | 9/2014 | Kuwabara | H02M 1/08 | 327/419 |
| 8,878,573 B2 * | 11/2014 | Sugahara | H03K 17/168 | 326/83 |
| 9,143,079 B2 * | 9/2015 | Kakimoto | H02P 27/06 | |
| 9,184,739 B2 * | 11/2015 | Kaneko | H02M 1/08 | |
| 2004/0041595 A1 * | 3/2004 | Ogawa | G01R 31/3167 | 327/94 |
| 2005/0128671 A1 * | 6/2005 | Miyamoto | H02M 7/538 | 361/118 |
| 2011/0273206 A1 * | 11/2011 | Lee | H02M 1/08 | 327/109 |
| 2014/0049866 A1 * | 2/2014 | Reiter | H03K 17/0828 | 361/86 |
| 2016/0118891 A1 * | 4/2016 | Hashimoto | H02M 1/32 | 323/271 |
| 2016/0173094 A1 * | 6/2016 | Choi | H03K 17/08128 | 327/109 |
| 2016/0211767 A1 * | 7/2016 | Hotta | H02M 1/08 | |
| 2018/0131364 A1 * | 5/2018 | Kaneda | H03K 17/166 | |

\* cited by examiner

POWER SEMICONDUCTOR MODULE AND DRIVE CIRCUIT

CROSS-REFERENCE TO RELATED APPLICATION

This application claims the benefit of Japanese Patent Application No. 2017-007129, filed on Jan. 18, 2017, the entire disclosure of which is incorporated by reference herein.

FIELD OF THE INVENTION

The present disclosure relates to a power semiconductor module and a drive circuit which are capable of suppressing an unintended oscillation of a gate voltage at the time of a short-circuit of an insulated-gate type power semiconductor device.

BACKGROUND

Recently, various power conversion apparatuses like an inverter and a converter which utilize insulated-gate type power semiconductor devices, such as high-voltage-withstandable IGBT and power MOS-FET, are in development. In general, this type of power conversion apparatus is formed as a power semiconductor module that includes a power semiconductor device and a drive circuit thereof. The drive circuit controls a gate voltage to be applied to a control electrode of the power semiconductor device in accordance with an input signal, thereby turning ON and OFF the power semiconductor device.

In the meantime, when the power semiconductor device is short-circuited in the power semiconductor module, a phenomenon such that the gate voltage oscillates is often observed. More specifically, for example, as illustrated in FIG. 7 that indicates changes in a gate voltage Vge, collector voltage Vce, and collector current Ic when an IGBT turns ON, the gate voltage Vge oscillates in some cases. Note that FIG. 7 indicates an oscillation phenomenon at the time of the short-circuit of an IGBT which is described in the document, Power Electronic Specialist Conference (PESC), 2002, pp. 1758-1763.

This oscillation phenomenon of the gate voltage Vge causes not only Electro-Magnetic Interference (EMI) to other electronic apparatuses due to electromagnetic waves emitted owing to oscillation, but also a gate destruction of the power semiconductor device. Hence, a suppression of the oscillation of the gate voltage Vge is desirable.

The gate voltage oscillation is caused by the presence of a resonant circuit formed by parasitic capacitances, inductances, and wiring resistances, etc., in the power semiconductor module. Hence, according to conventional technologies, for example, a resistance value of the gate resistance is set to be high for damping the resonant circuit, or the Q-value in the resonant circuit is decreased so as to suppress an oscillation.

In contrast, JP 2014-230307 A discloses, when simultaneously and parallelly driving multiple power semiconductor devices, in order to decrease a current unbalance among the power semiconductor devices, the values (resistance values) of the gate resistances of the multiple power semiconductor devices are changed. In particular, JP 2014-230307 A discloses to have a time lag in the timing of changing the resistance value of the gate resistance in accordance with a current flowing through each of the multiple power semiconductor devices.

According to the technology disclosed in JP 2014-230307 A, because of the time lag in the timing of changing the resistance value of the gate resistance in accordance with a current flowing through each of the multiple power semiconductor devices, a time lag can be set in the turn-ON timing of each power semiconductor device and in the turn-OFF timing thereof. Consequently, the current unbalance among the multiple power semiconductor devices can be effectively decreased.

In the meantime, in recent years, there is a tendency such that the Q value of the resonant circuit formed in a power semiconductor module increases in accordance with a reduction of inductance of the packaged power semiconductor module, a reduction of capacity due to fast-speed operation of a power semiconductor device, and further an increase of gain of the power semiconductor device due to an increase of allowed current to flow therethrough. In accordance with such a tendency, the oscillation of the gate voltage Vge observed at the power semiconductor module can increase in comparison with conventional technologies. In order to suppress such an intense oscillation of the gate voltage Vge, a dumping to the resonant circuit by, for example, the gate resistance that has a much greater resistance value will be necessary. When, however, the resistance value of the gate resistance is increased, the switching speed of the power semiconductor device decreases, and further a switching loss increases.

The technology of achieving the variable gate resistance disclosed in JP 2014-230307 A merely has a time lag in the timing of changing the resistance values of the multiple gate resistances in accordance with respective currents flowing through the multiple power semiconductor devices. Hence, this technology does not address the oscillation of the gate voltage due to a short-circuit of the power semiconductor device.

The present disclosure has been made in view of the foregoing circumstances, and an objective is to provide a power semiconductor module and a drive circuit thereof which employ a simple structure that can effectively suppress an oscillation of a gate voltage at the time of a short-circuit of an insulated-gate type power semiconductor device in the power semiconductor module.

SUMMARY OF THE INVENTION

In order to accomplish the above objective, a power semiconductor module according to the present disclosure includes:

an insulated-gate type power semiconductor device, such as a high-voltage-withstandable IGBT or MOSFET which includes a control electrode and a pair of main electrodes, and which controls a current flowing between the pair of main electrodes in accordance with a gate voltage applied to the control electrode; and a drive circuit which controls the gate voltage in accordance with an input signal, and which drives the power semiconductor device so as to turn ON and OFF.

In particular, the above drive circuit includes:

a variable resistance circuit that changes a resistance value of a gate resistance in order to control the power semiconductor device; and a short-circuit state detecting circuit which maintains the resistance value of the variable resistance circuit to be a predetermined value at a time of a normal operation of the power semiconductor device, and which increases the resistance value of the variable resistance circuit so as to be greater than the predetermined value and suppresses an oscillation in the power semiconductor device when a state in which the power semiconductor device is to be short-circuited is detected.

When the current flowing between the pair of main electrodes of the power semiconductor device exceeds a predetermined reference current value, the short-circuit state detecting circuit may detect the state of the power semiconductor device to be short-circuited. In addition, the current flowing between the pair of main electrodes of the power semiconductor device may be a sensing current which is detected through a current detection electrode of the power semiconductor device, and which is proportional to a main current flowing between the pair of main electrodes.

Still further, when a voltage applied between the pair of main electrodes of the power semiconductor device exceeds a predetermined reference voltage value, more specifically, when the collector voltage of the IGBT that is being driven so as to turn ON exceeds a predetermined reference voltage value, the short-circuit state detecting circuit may detect a state of the power semiconductor device to be oscillated.

The resistance value of the variable resistance circuit at the time of the normal operation of the power semiconductor device may be set based on a loss of the power semiconductor device and a voltage surge thereof. In addition, the resistance value of the variable resistance circuit to suppress an oscillation in the power semiconductor device may be set so as to decrease a Q value of a resonant circuit in the power semiconductor module, and set as a sufficient value that suppresses an oscillation under a predetermined estimated short-circuit state.

The variable resistance circuit may be attached to an external side of the drive circuit, and have the resistance value set as variable in accordance with an output by the short-circuit state detecting circuit. Alternatively, the variable resistance circuit may be built in the drive circuit, and have the resistance value set as variable in accordance with an output by the short-circuit state detecting circuit.

More specifically, the variable resistance circuit may include a plurality of resistors which is connected in series or in parallel through a plurality of semiconductor switch devices selectively turned ON and OFF in accordance with an output by the short-circuit state detecting circuit, and which changes a synthesis resistance value, or a digital potentiometer having a resistance value set as variable in accordance with an output by the short-circuit state detecting circuit.

According to the above power semiconductor module and the drive circuit thereof employing the above structure, the resistance value of the variable resistance circuit is maintained to a predetermined value that is set based on the switching speed of the power semiconductor device and the switching loss thereof at the time of the normal operation of the power semiconductor device. In addition, when the short-circuit state of the power semiconductor device is detected, the resistance value of the variable resistance circuit is increased so as to be greater than the predetermined value at the time of the normal operation, thus suppressing an occurrence of a voltage surge in the power semiconductor device, and decreasing the Q value of the resonant circuit in the power semiconductor module, thereby suppressing an oscillation of the gate voltage.

Consequently, by simply detecting a short-circuit state and increasing the gate resistance, an oscillation of the gate voltage can be effectively suppressed prior to agate destruction of the power semiconductor device without a reduction of the switching speed of the power semiconductor device and an increase of the switching loss thereof.

DETAILED DESCRIPTION OF THE EMBODIMENTS

A power semiconductor module provided with an IGBT representing an insulated-gate type power semiconductor device and a drive circuit thereof according to embodiments of the present disclosure will be described below with reference to the figures.

Figure 1:
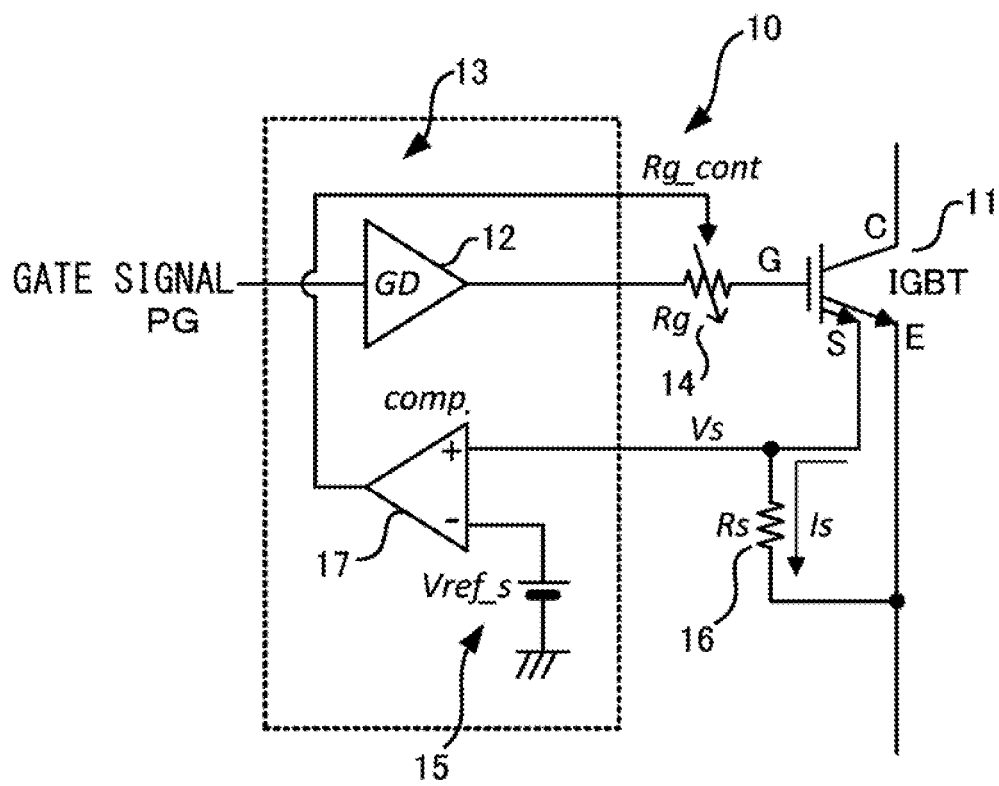
FIG. 1 is a schematic structure diagram of a major part of a power semiconductor module according to a first embodiment of the present disclosure.

FIG. 1 is a diagram illustrating a basic schematic structure of a power semiconductor module 10 according to a first embodiment of the present disclosure, and reference numeral 11 is a high-voltage-withstandable IGBT that is an insulated-gate type power semiconductor device. The power semiconductor module 10 includes the high-voltage-withstandable IGBT 11 and a drive circuit 13 that mainly includes a Gate Driver (GD) 12 which turns ON and OFF the IGBT 11. The gate driver (GD) 12 controls a gate voltage Vge to be applied to the gate that is a control electrode of the IGBT 11 basically in accordance with a pulse gate signal PG applied to the input terminal of the gate driver 12, thereby turning ON and OFF the IGBT 11.

In addition, a variable resistance circuit (gate resistance circuit) 14 is provided at the output side of the gate driver (GD) 12. This variable resistance circuit 14 changes the resistance value of a gate resistance Rg to the IGBT 11 in accordance with a control signal Rg_cont to be described later, thereby suppressing an oscillation of the gate voltage Vge at the time of the short-circuit of the IGBT 11. The resistance value of the gate resistance Rg in the variable resistance circuit (gate resistance circuit) 14 is set in consideration of the loss of the IGBT 11 and the voltage surge when the IGBT 11 operates normally.

The drive circuit 13 includes a short-circuit state detecting circuit 15 which creates the control signal Rg_cont in accordance with the magnitude of a collector current Ic that flows through the IGBT 11, and which controls the resistance value of the gate resistance Rg in the variable resistance circuit 14. This short-circuit state detecting circuit 15 includes a current detection circuit 16 formed by, for example, a current detection resistor Rs connected to a current detection electrode S of the IGBT 11, and a comparator 17.

The current detection circuit 16 causes a sensing current Is proportional to the collector current (main current) of the IGBT 11 to flow through the current detection resistor Rs, and creates a current detection voltage Vs corresponding to the collector current Ic. In addition, the comparator 17 compares the current detection voltage Vs detected by the current detection circuit 16 with a preset reference voltage Vref_s. The comparator 17 detects a state of the IGBT 11 to be short-circuited when the current detection voltage Vs exceeds the reference voltage Vref_s, and outputs the control signal Rg_cont.

When the control signal Rg_cont is given, the variable resistance circuit 14 sets the resistance value of the gate resistance Rg to be a higher resistance value than that of the normal operation, thereby decreasing the Q value of the resonant circuit (unillustrated) formed in the power semiconductor module 10, thus suppressing an oscillation of the gate voltage Vge.

When the current detection voltage Vs subsequently become lower than the reference voltage Vref_s, the comparator 17 detects that the IGBT 11 has returned to the normal operation, and terminates the output of the control signal Rg_cont. In accordance with the termination of the output of the control signal Rg_cont, the variable resistance circuit 14 returns the resistance value of the gate resistance Rg to be the resistance value at the normal operation. Hence, the IGBT 11 operates normally with the gate resistance Rg that has the resistance value set again with the loss and the voltage surge both being taken into consideration.

Figure 2:
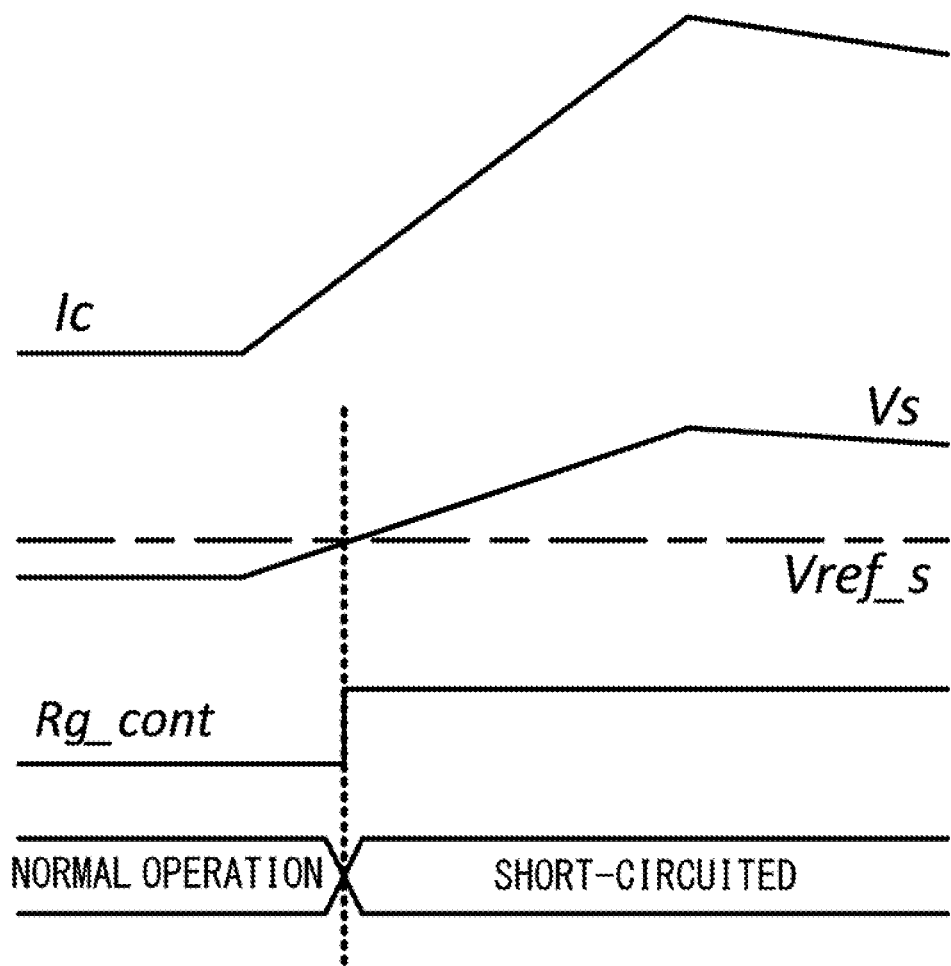
FIG. 2 is a timing chart illustrating an operation of the power semiconductor module illustrated in FIG. 1.

According to the power semiconductor module 10 employing the structure as describe above, when the current detection voltage Vs detected by the current detection circuit 16 exceeds the reference voltage Vref_s along with the increase of the collector current (main current) Ic which flows through the IGBT 11 as illustrated in FIG. 2, the comparator 17 detects the state that the IGBT 11 is to be short-circuited. Next, the comparator 17 outputs the control signal Rg_cont in the H level at this short-circuit detection timing. Consequently, the variable resistance circuit 14 forcibly changes the resistance value of that gate resistance Rg to be a higher value than a normal resistance value of the gate resistance Rg that is set with the loss of the IGBT 11 and the voltage surge being taken into consideration.

Hence, when the IGBT 11 becomes the state to be short-circuited, the resistance value of the gate resistance Rg relative to the IGBT 11 is set to be a large value, and thus the Q value of the resonant circuit (unillustrated) formed in the power semiconductor module 10 is decreased. Consequently, before the IGBT 11 becomes the short-circuit state, the oscillation of the gate voltage Vge along with the increase of the collector current Ic can be suppressed, and thus a gate destruction, etc., of the IGBT 11 can be prevented beforehand. IN addition, in the normal operation at which the current detection voltage Vs is lower than the reference voltage Vref_s, the IGBT 11 can be driven so as to turn ON and OFF at the gate resistance Rg that has a resistance value set with the loss of the IGBT 11 and the voltage surge being taken into consideration. Hence, disadvantages such that the switching speed of the IGBT 11 decreases in the normal operation and the switching loss increases can be avoided.

Figure 3:
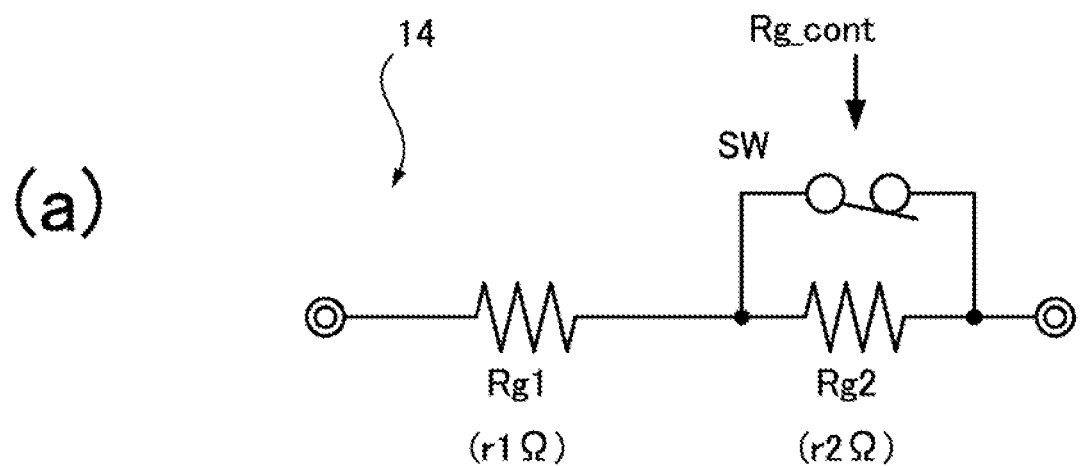
FIG. 3 is a diagram illustrating an example structure of a variable resistance circuit.
Figure 3:
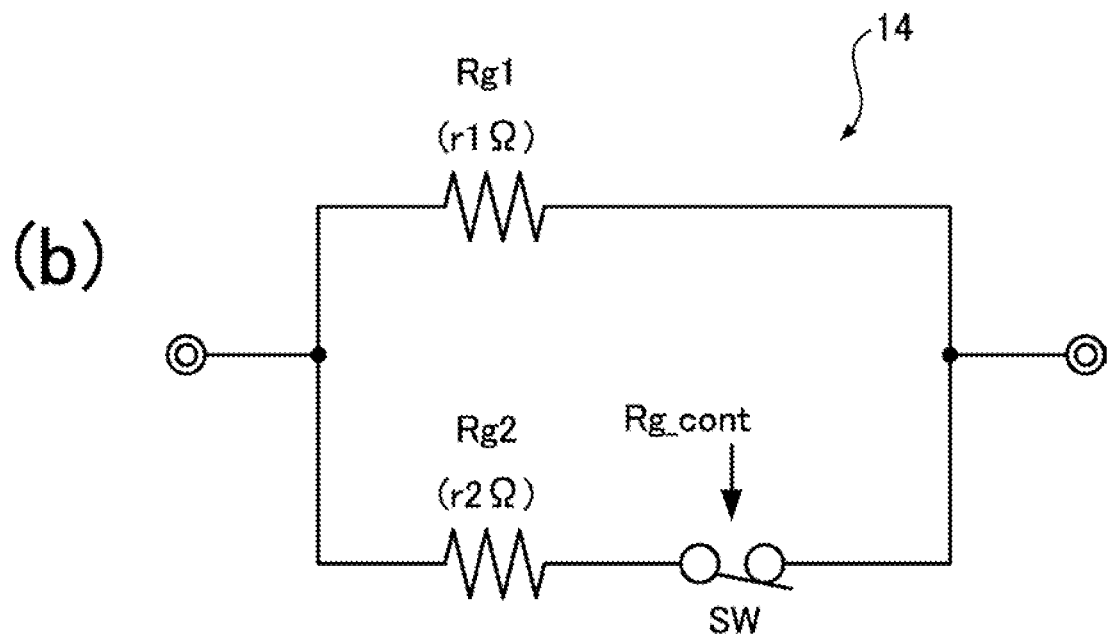

Note that, as illustrated in FIGS. 3A and 3B, the above variable resistance circuit 14 may be simply formed by multiple fixed resistors Rg1, Rg2, and a semiconductor switch device SW. The variable resistance circuit 14 illustrated in FIG. 3A includes the two fixed resistors Rg1, Rg2 connected in series, and the semiconductor switch device SW connected in parallel with the fixed resistor Rg2. This variable resistance circuit 14 turns ON (current carrying) the semiconductor switch device SW at the time of the normal operation of the IGBT 11 to maintain the gate resistance Rg to be a resistance value r1 of the fixed resistor Rg1, and turns OFF (current interruption) the semiconductor switch device SW at the time of the short-circuit of the IGBT 11 to set the gate resistance Rg to be a synthesis resistance value (r1+r2) of the fixed resistors Rg1, Rg2.

The variable resistance circuit 14 illustrated in FIG. 3B includes the two fixed resistors Rg1, Rg2 connected in parallel with each other, and the semiconductor switch device SW connected in parallel with the fixed resistor Rg2. This variable resistance circuit 14 turns ON (current carrying) the semiconductor switch device SW at the time of the normal operation of the IGBT 11 to set gate resistance Rg to be a synthesis resistance value [r1×r2/(r1+r2)] of the fixed resistors Rg1 and Rg2, and turns OFF (current interruption) the semiconductor switch device SW at the time of the short-circuit of the IGBT 11, and sets the gate resistance Rg to be the resistance value r1 of the fixed resistor Rg1.

Figure 4:
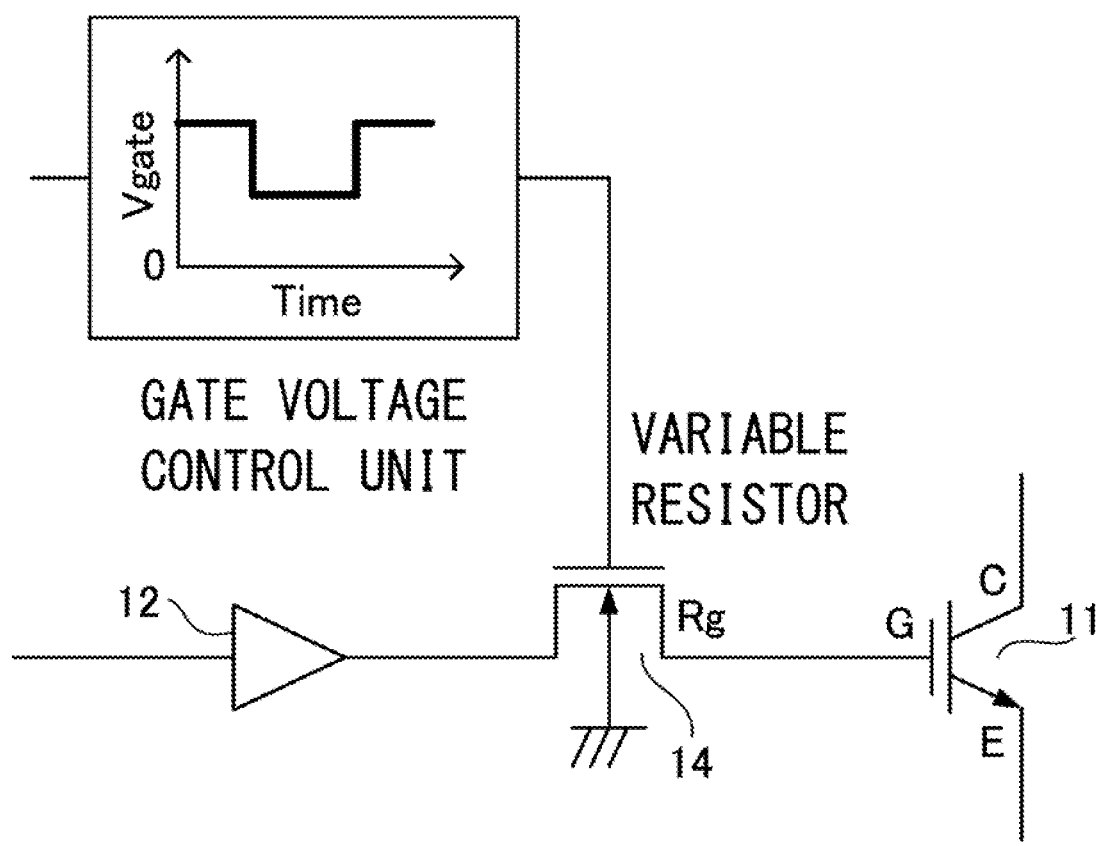
FIG. 4 is a diagram illustrating another example structure of the variable resistance circuit.

The variable resistance circuit 14 may be a digital potentiometer which has the gate voltage controlled in accordance with the control signal Rg_cont, and which changes the resistance value as illustrated in FIG. 4. In addition, the respective resistance values r1 and r2 of the fixed resistors Rg1, Rg2 may be set in accordance with the operating conditions of the IGBT 11. Still further, this variable resistance circuit 14 may be externally provided between the output end of the gate driver (GD) 12 and the gate electrode of the IGBT 11, but may be integrally built in the output side of the gate driver (GD) 12.

Next, a power semiconductor module according to a second embodiment of the present disclosure will be described.

Figure 5:
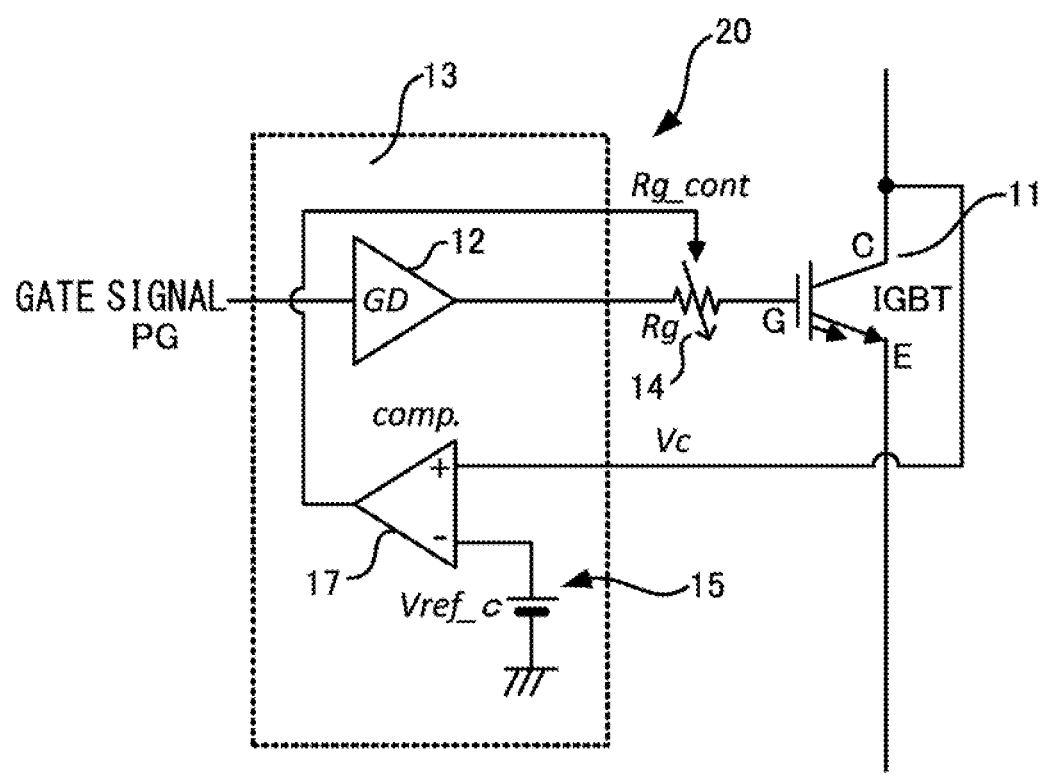
FIG. 5 is a schematic structure diagram of a major part of a power semiconductor module according to a second embodiment of the present disclosure.

FIG. 5 is a diagram illustrating the schematic diagram of a power semiconductor module 20 according to the second embodiment, and the same component as that of the power semiconductor module 10 illustrated in FIG. 1 will be denoted by the same reference numeral. Hence, the duplicated explanation for the same component will be omitted.

A feature of the power semiconductor module 20 according to this second embodiment is to monitor a collector voltage Vce of the IGBT 11 to detect a state that the IGBT 11 is to be short-circuited although the power semiconductor module 10 in the first embodiment monitors the collector current Ic flowing through the IGBT 11 to detect a state that the IGBT 11 is to be short-circuited.

That is, this power semiconductor module 20 compares the collector voltage Vce of the IGBT 11 with a predetermined reference voltage Vref_c by the comparator 17, and outputs a control signal Rg_cont. More specifically, when the collector voltage Vce of the IGBT 11 exceeds the reference voltage Vref_c while the IGBT 11 is driven to be turned ON, the comparator 17 detects a state that the IGBT 11 is to be short-circuited, and output the control signal Rg_cont.

Figure 6:
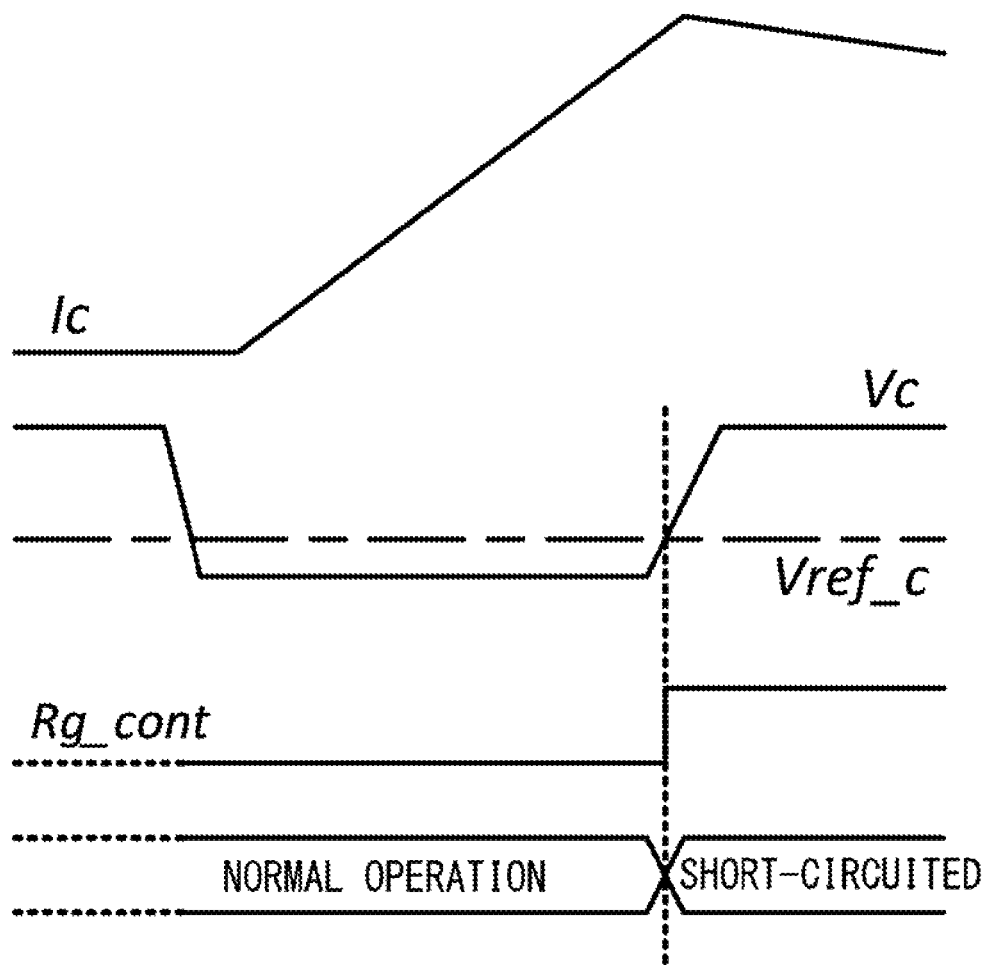
FIG. 6 is a timing chart illustrating an operation of the power semiconductor module illustrated in FIG. 5.
Figure 7:
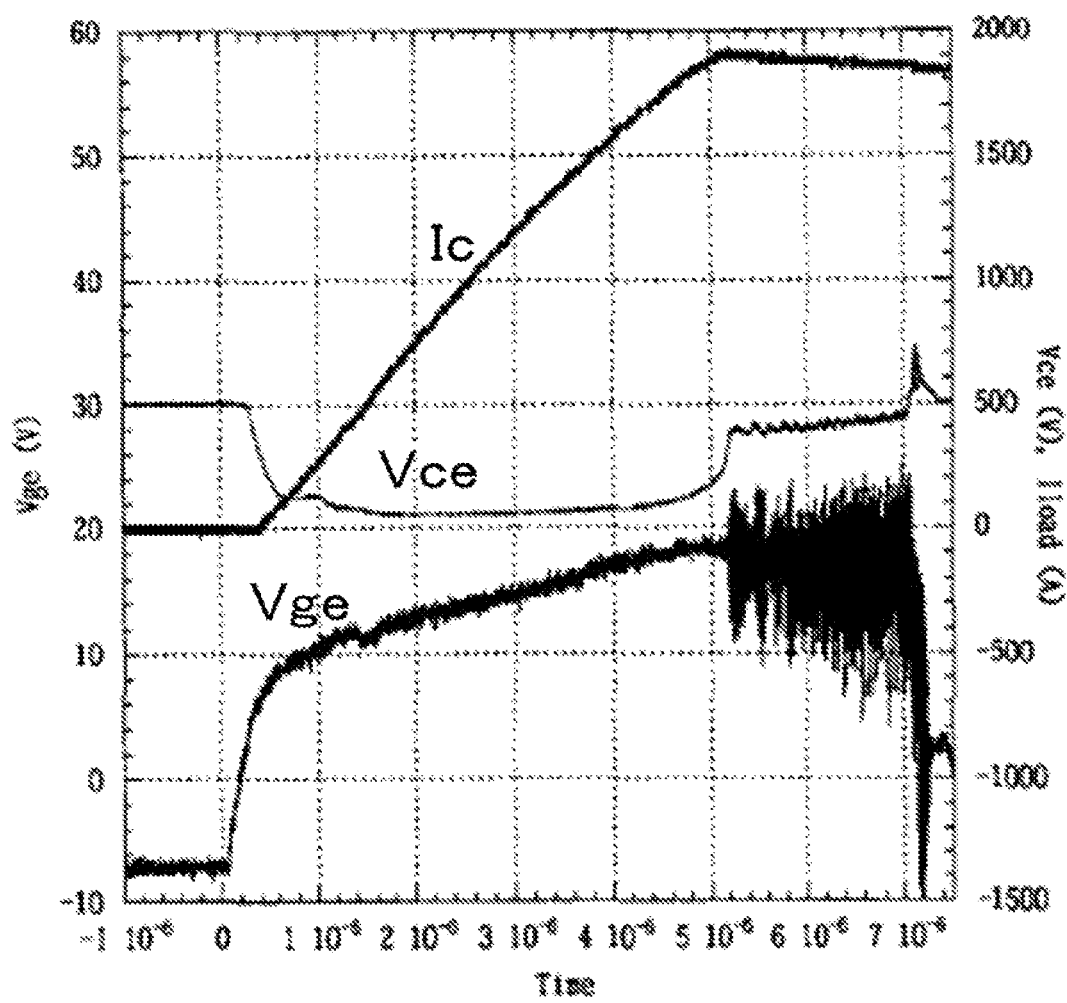
FIG. 7 is a diagram illustrating an example oscillation phenomenon in an IGBT at the time of short-circuit.

As illustrated in FIG. 6, according to the power semiconductor module 20 employing the structure as described above, while the collector current Ic is increasing along with the turn-ON operation of the IGBT 11, when the collector voltage Vce of the IGBT 11 becomes higher than the predetermined reference voltage Vref_c, this is detected as a foreboding sign that the gate voltage Vge is to be oscillated. Next, when the collector voltage Vce exceeds the reference voltage Vref_c, the control signal Rg_cont is generated as an output by the comparator 17. In addition, when the collector voltage Vce is less than the reference voltage Vref_c, a state that the IGBT 11 is in the normal operation can be detected.

Hence, according to the power semiconductor module 20 employing a structure to detect a state that the gate voltage Vge of the IGBT 11 is to be oscillated based on the collector voltage Vce of the IGBT 11, like the power semiconductor module 10 described in the first embodiment, the resistance value of the gate resistance Rg at the time of the short-circuit of the IGBT 11 can be set to be higher than that of the normal operation. Accordingly, an oscillation of the gate voltage Vge of the IGBT 11 can be suppressed beforehand also in the second embodiment.

The present disclosure is not limited to each of the above embodiments. Although the description has been given of an example case in which the power semiconductor device is an IGBT, the present disclosure is likewise applicable to a case in which a high-voltage-withstandable power MOSFET is adopted. In addition, the description has been given of the power semiconductor modules 10, 20 that drive respective singles power semiconductor devices, but when the power conversion device is formed by connecting multiple power semiconductor devices in parallel with each other, the present disclosure is also applicable to multiple power semiconductor modules that drive the multiple power semiconductor devices, respectively. Still further, various circuit structures which have been proposed conventionally are applicable to the variable resistance circuit 14. In fact, the present disclosure can be carried out in other various forms without departing from the scope of the present disclosure.

What is claimed is:

1. A power semiconductor module comprising:
   a power semiconductor device which comprises a control electrode and a pair of main electrodes, and which controls a current flowing between the pair of main electrodes in accordance with a gate voltage applied to the control electrode; and
   a drive circuit which controls the gate voltage in accordance with an input signal, and which drives the power semiconductor device so as to turn ON and OFF,
   wherein the drive circuit comprises:
   a variable resistance circuit that changes a resistance value of a gate resistance to control the power semiconductor device; and
   a short-circuit state detecting circuit which maintains the resistance value of the variable resistance circuit to be a predetermined value at a time of a normal operation of the power semiconductor device, and which increases the resistance value of the variable resistance circuit so as to be greater than the predetermined value and suppresses an oscillation of the gate voltage in the power semiconductor device when a short-circuit state of the power semiconductor device is detected while the power semiconductor device is driven to be turned ON,
   wherein the short-circuit state detecting unit comprises a singular comparator that compares a current detection voltage corresponding to the current flowing between the pair of main electrodes of the power semiconductor device while the power semiconductor device is being driven to turn ON with a singular reference voltage that uniquely defines a state of the power semiconductor device to be short-circuited, the singular comparator outputting, to the variable resistance circuit, a singular control signal to increase the resistance value of the variable resistance circuit so as to be greater than the predetermined value when the current detection voltage exceeds the reference voltage,
   wherein the singular reference voltage is supplied from a different voltage source from a voltage source that applies a voltage between the pair of main electrodes of the power semiconductor device, and is a voltage that is a reference for a determination on only the state of the power semiconductor device to be short-circuited.

2. The power semiconductor module according to claim 1, wherein the current flowing between the pair of main electrodes of the power semiconductor device is a sensing current which is detected through a current detection electrode of the power semiconductor device, and which is proportional to a main current flowing between the pair of main electrodes.

3. The power semiconductor module according to claim 1, wherein the power semiconductor device is an IGBT or a MOSFET.

4. The power semiconductor module according to claim 1, wherein:
   the resistance value of the variable resistance circuit at the time of the normal operation of the power semiconductor device is set based on a loss of the power semiconductor device and a voltage surge thereof; and
   the resistance value of the variable resistance circuit to suppress an oscillation in the power semiconductor device is set so as to decrease a Q value of an oscillation circuit in the power semiconductor module.

5. The power semiconductor module according to claim 1, wherein the variable resistance circuit is attached to an external side of the drive circuit, and has the resistance value set as variable in accordance with an output by the short-circuit state detecting circuit.

6. The power semiconductor module according to claim 1, wherein the variable resistance circuit is built in the drive circuit, and has the resistance value set as variable in accordance with an output by the short-circuit state detecting circuit.

7. The power semiconductor module according to claim 1, wherein the variable resistance circuit comprises a plurality of resistors which is connected in series or in parallel through a plurality of semiconductor switch devices selectively turned ON and OFF in accordance with an output by the short-circuit state detecting circuit, and which changes a synthesis resistance value, or comprises a digital potentiometer having a resistance value set as variable in accordance with an output by the short-circuit state detecting circuit.

8. A drive circuit that controls a gate voltage to a power semiconductor device to drive the power semiconductor device so as to turn ON and OFF, the drive circuit comprising:
   a variable resistance circuit that changes a resistance value of a gate resistance to control the power semiconductor device; and
   a short-circuit state detecting circuit which maintains the resistance value of the variable resistance circuit to be a predetermined value at a time of a normal operation of the power semiconductor device, and which increases the resistance value of the variable resistance circuit so as to be greater than the predetermined value while the power semiconductor device is driven to be turned ON and suppresses an oscillation of the gate voltage in the power semiconductor device when a short-circuit state of the power semiconductor device is detected,
   wherein the short-circuit state detecting unit comprises a singular comparator that compares a current detection voltage corresponding to a current flowing between a pair of main electrodes of the power semiconductor device while the power semiconductor device is being driven to turn ON with a singular reference voltage that uniquely defines a state of the power semiconductor device to be short-circuited, the singular comparator outputting, to the variable resistance circuit, a singular control signal to increase the resistance value of the variable resistance circuit so as to be greater than the predetermined value when the current detection voltage exceeds the singular reference voltage, wherein the singular reference voltage is supplied from a different voltage source from a voltage source that applies a voltage between the pair of main electrodes of the power semiconductor device, and is a voltage that is a reference for a determination on only the state of the power semiconductor device to be short-circuited.

9. The drive circuit according to claim 8, wherein:

the resistance value of the variable resistance circuit at the time of the normal operation of the power semiconductor device is set based on a loss of the power semiconductor device and a voltage surge thereof; and the resistance value of the variable resistance circuit to suppress an oscillation in the power semiconductor device is set so as to decrease a Q value of an oscillation circuit in the power semiconductor module.

10. The drive circuit according to claim 8, wherein the variable resistance circuit comprises a plurality of resistors which is connected in series or in parallel through a plurality of semiconductor switch devices selectively turned ON and OFF in accordance with an output by the short-circuit state detecting circuit, and which changes a synthesis resistance value, or comprises a digital potentiometer having a resistance value set as variable in accordance with an output by the short-circuit state detecting circuit.

* * * * *